(12) United States Patent
Babcock et al.

(10) Patent No.: US 8,525,233 B1
(45) Date of Patent: Sep. 3, 2013

(54) SIGE HETEROJUNCTION BIPOLAR TRANSISTOR WITH A SHALLOW OUT-DIFFUSED P+ EMITTER REGION

(75) Inventors: Jeffrey A. Babcock, Sunnyvale, CA (US); Alexei Sadovnikov, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 53 days.

(21) Appl. No.: 13/429,274

(22) Filed: Mar. 23, 2012

(51) Int. Cl.
*H01L 29/66* (2006.01)

(52) U.S. Cl.
USPC ........... 257/197; 257/198; 257/591; 257/592; 257/593; 257/565; 257/585

(58) Field of Classification Search
USPC .................. 257/197, 198, 565–585, 591–593
See application file for complete search history.

(56) References Cited

PUBLICATIONS

Babcock, Jeff A. et al, "CBC8: A 0.25μm SiGe-CBiCMOS Technology Platform on Thick-Film SOI for High-Performance Analog and RF IC Design", 2010 IEEE Bipolar/BiCMOS Circuits and Technology Meeting (BCTM), 2010, pp. 41-44.

*Primary Examiner* — Steven Loke
*Assistant Examiner* — Junaiden Mirsalahuddin
(74) *Attorney, Agent, or Firm* — Eugene C. Conser; Wade J. Brady, III; Frederick J. Telecky, Jr.

(57) ABSTRACT

A pnp SiGe heterojunction bipolar transistor (HBT) reduces the rate that p-type dopant atoms in the p+ emitter of the transistor out diffuse into a lowly-doped region of the base of the transistor by epitaxially growing the emitter to include a single-crystal germanium region and an overlying single-crystal silicon region.

12 Claims, 8 Drawing Sheets

SIGE HETEROJUNCTION BIPOLAR TRANSISTOR WITH A SHALLOW OUT-DIFFUSED P+ EMITTER REGION

BACKGROUND OF THE INVENTION

1. Field of the Invention

The present invention relates to a SiGe heterojunction bipolar transistor (HBT) and, more particularly, to a SiGe HBT with a shallow out-diffused p+ emitter region.

2. Description of the Related Art

A bipolar transistor is a well-known structure that has an emitter, a base connected to the emitter, and a collector connected to the base. The emitter has a first conductivity type, the base has a second conductivity type, and the collector has the first conductivity type. For example, an npn bipolar transistor has an n-type emitter, a p-type base, and an n-type collector, while a pnp bipolar transistor has a p-type emitter, an n-type base, and a p-type collector.

When the emitter and base are formed from different semiconductor materials, such as silicon and germanium, respectively, the interface is known as a heterojunction. The heterojunction limits the number of holes that can be injected into the emitter from the base. Limiting the number of injected holes allows the dopant concentration of the base to be increased which, in turn, reduces the base resistance and increases the maximum frequency of the transistor.

Figure 1:
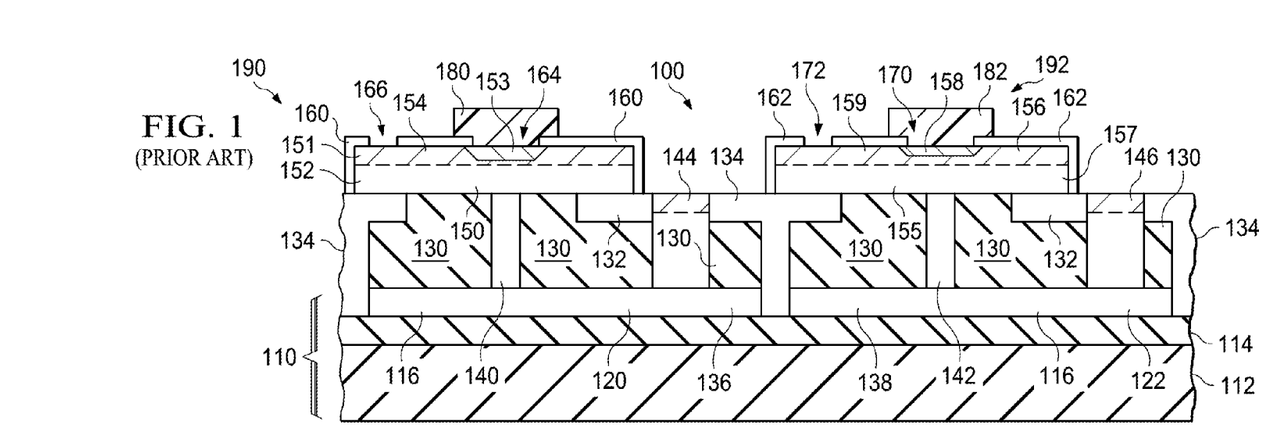
FIG. 1 is a cross-sectional view illustrating an example of a prior-art SiGe heterojunction bipolar structure 100.

FIG. 1 shows a cross-sectional view that illustrates an example of a prior-art SiGe heterojunction bipolar structure 100. As shown in FIG. 1, bipolar structure 100 includes a silicon-on-oxide (SOI) wafer 110, which has a silicon handle wafer 112, a buried insulation layer 114 that touches silicon handle wafer 112, and a single-crystal silicon substrate 116 that touches buried insulation layer 114. Silicon substrate 116, in turn, has a heavily-doped, p conductivity type (p+) buried region 120 and a heavily-doped, n conductivity type (n+) buried region 122.

As further shown in FIG. 1, bipolar structure 100 includes a single-crystal silicon epitaxial structure 130 that touches the top surface of silicon substrate 116. Epitaxial structure 130 has a very low dopant concentration, except for regions of out diffusion. For example, a number of p-type atoms out diffuse from p+ buried layer 120 into epitaxial structure 130, and a number of n-type atoms out diffuse from n+ buried layer 122 into epitaxial structure 130. In the present example, epitaxial structure 130 is a very lightly doped, n conductivity type (n−) region, excluding the regions of out diffusion.

Bipolar structure 100 also includes a number of shallow trench isolation structures 132 that touch epitaxial structure 130, and a deep trench isolation structure 134 that touches and extends through epitaxial structure 130 as well as silicon substrate 116 to touch buried insulation layer 114. Buried insulation layer 114 and deep trench isolation structure 132 form an electrically-isolated, single-crystal silicon region 136 and a laterally-adjacent, electrically-isolated, single-crystal silicon region 138.

In addition, bipolar structure 100 includes a lightly-doped, p conductivity type (p−) region 140 that extends from the top surface of silicon epitaxial structure 130 down through epitaxial structure 130 to touch p+ buried region 120, and a lightly-doped, n conductivity type (n−) region 142 that extends from the top surface of silicon epitaxial structure 130 down through epitaxial structure 130 to touch n+ buried region 122.

Bipolar structure 100 also includes a p conductivity type sinker region 144 that extends from the top surface of silicon epitaxial structure 130 down through epitaxial structure 130 to p+ buried region 120, and an n conductivity type sinker region 146 that extends from the top surface of silicon epitaxial structure 130 down through epitaxial structure 130 to n+ buried region 122.

Sinker region 144 includes a heavily-doped, p conductivity type (p+) surface region and a moderately-doped, p conductivity type (p) lower region, while sinker region 146 includes a heavily-doped, n conductivity type (n+) surface region and a moderately-doped, n conductivity type (n) lower region.

Further, bipolar structure 100 includes a SiGe epitaxial structure 150 that touches and lies over silicon epitaxial structure 130, a shallow trench isolation structure 132, and p− region 140. SiGe epitaxial structure 150 has a number of layers including a top layer 151 and a lower layer 152 that touches and lies below top layer 151.

Top layer 151 includes a single-crystal silicon region and a polycrystalline silicon region. Top layer 151 also has an out-diffused emitter region 153, and an outer region 154 that touches out-diffused emitter region 153. Out-diffused emitter region 153, which lies in the single-crystal silicon region, has a heavy dopant concentration and a p conductivity type (p+).

Outer region 154, which horizontally surrounds out-diffused emitter region 153, has a very low dopant concentration and, in the present example, an n conductivity type (n−). Lower layer 152, in turn, includes a single-crystal germanium region that touches the single-crystal silicon region of top layer 151, and a polycrystalline germanium region that touches the polycrystalline silicon region of top layer 151. Lower layer 152 also has a heavy dopant concentration and an n conductivity type (n+). Thus, the single-crystal germanium region has an n+ dopant concentration.

Bipolar structure additionally includes a SiGe epitaxial structure 155 that touches and lies over silicon epitaxial structure 130, a shallow trench isolation structure 132, and n− region 142. SiGe epitaxial structure 155 has a number of layers including a top layer 156 and a lower layer 157 that touches and lies below top layer 156.

Top layer 156 includes a single-crystal silicon region and a polycrystalline silicon region. Top layer 156 also has an out-diffused emitter region 158, and an outer region 159 that touches out-diffused emitter region 158. Out-diffused emitter region 158, which lies in the single-crystal silicon region of top layer 156, has a heavy dopant concentration and an n conductivity type (n+).

Outer region 159, which horizontally surrounds out-diffused emitter region 158, has a very low dopant concentration and, in the present example, an n conductivity type (n−). Lower layer 157, in turn, includes a single-crystal germanium region that touches the single-crystal silicon region of top layer 156, and a polycrystalline germanium region that touches the polycrystalline silicon region of top layer 156. Lower layer 157 also has a heavy dopant concentration and a p conductivity type (p+).

Bipolar structure 100 additionally includes an isolation structure 160 that touches SiGe epitaxial structure 150, and an isolation structure 162 that touches SiGe epitaxial structure 155. Isolation structures 160 and 162 are electrically non-conductive. Isolation structure 160 has an emitter opening 164 that exposes the single-crystal silicon region of top layer 151 of SiGe epitaxial structure 150, and a contact opening 166 that exposes the polycrystalline silicon region of top layer 151 of SiGe epitaxial structure 150. Similarly, isolation structure 162 has an emitter opening 170 that exposes the single-crystal silicon region of top layer 156 of SiGe epitaxial structure 155, and a contact opening 172 that exposes the polycrystalline silicon region of top layer 156 of SiGe epitaxial structure 155.

Bipolar structure 100 further includes a heavily-doped, p conductivity type (p+) polysilicon structure 180 that touches isolation structure 160 and extends through emitter opening 164 to touch the p+ out-diffused emitter region 153 of SiGe epitaxial structure 150. Bipolar structure 100 also includes a heavily-doped, n conductivity type (n+) polysilicon structure 182 that touches isolation structure 162 and extends through emitter opening 170 to touch the n+ out-diffused emitter region 158 of SiGe epitaxial structure 155.

P+ polysilicon structure 180 and p+ out-diffused emitter region 153 form the emitter, the remaining portion of SiGe epitaxial structure 150 forms the n-type base, and the combination of p+ buried region 120, p− region 140, and p-type sinker region 144 form the collector of a pnp SiGe heterojunction bipolar transistor (HBT) 190.

In addition, n+ polysilicon structure 182 and n+ out-diffused emitter region 158 form the emitter, the remaining p-type portion of SiGe epitaxial structure 155 forms the p-type base, and the combination of n+ buried region 122, n− region 142, and n-type sinker region 146 form the collector of an npn SiGe HBT 192.

During an anneal in the fabrication of HBT 190 and HBT 192, p-type atoms in p+ polysilicon structure 180 out diffuse into top layer 151 of SiGe epitaxial structure 150 to form p+ emitter region 153, and n-type atoms in n+ polysilicon structure 182 out diffuse into top layer 156 of SiGe epitaxial structure 155 to form n+ emitter region 158.

One of the drawbacks of HBT 190 and HBT 192 is that p+ out-diffused emitter region 153 is significantly larger and deeper than n+ out-diffused emitter region 158 due to the higher diffusion rate of p-type atoms, such as boron, when compared to the lower diffusion rate of n-type atoms, such as phosphorous.

In applications where the pnp and npn parameters are to be matched as closely as possible, the significantly deeper depth of p+ out-diffused emitter region 153 when compared to the depth of n+ out-diffused emitter region 158 poses a problem. One approach to reducing the variation in the depths is to form a thin oxide layer on the portion of the single-crystal silicon region of top layer 151 of SiGe epitaxial structure 150 that is exposed by emitter opening 164.

Figure 2:
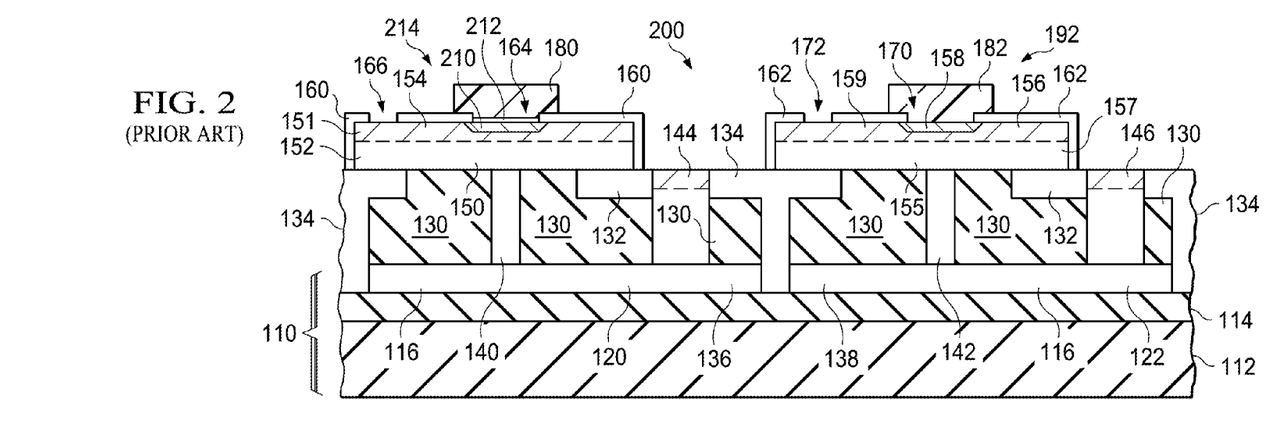
FIG. 2 is a cross-sectional view illustrating an example of a prior-art SiGe heterojunction bipolar structure 200.

FIG. 2 shows a cross-sectional view that illustrates an example of a prior-art SiGe heterojunction bipolar structure 200. SiGe heterojunction bipolar structure 200 is similar to SiGe heterojunction bipolar structure 100 and, as a result, utilizes the same reference numerals to designate the elements that are common to both structures.

As shown in FIG. 2, SiGe heterojunction bipolar structure 200 differs from SiGe heterojunction bipolar structure 100 in that SiGe heterojunction bipolar structure 200 utilizes a p+ out-diffused emitter region 210 in lieu of p+ out-diffused emitter region 153. P+ out-diffused emitter region 210 is similar to p+ out-diffused emitter region 153, except that p+ out-diffused emitter region 210 is smaller and shallower than p+ out-diffused emitter region 153.

SiGe heterojunction bipolar structure 200 also differs from SiGe heterojunction bipolar structure 100 in that SiGe heterojunction bipolar structure 200 includes an oxide layer 212 that lies between and touches p+ out-diffused emitter region 210 of SiGe epitaxial structure 150 and p+ polysilicon structure 180.

P+ polysilicon structure 180 and p+ out-diffused emitter region 210 form the emitter, the remaining portion of SiGe epitaxial structure 150 forms the n-type base, and the combination of p+ buried region 120, p− region 140, and p-type sinker region 144 form the collector of a pnp SiGe heterojunction bipolar transistor (HBT) 214.

During the anneal that causes the atoms to out diffuse, oxide layer 212 is thin enough to allow p-type atoms to diffuse through from p+ polysilicon structure 180 into the top layer 151 of SiGe epitaxial structure 150 to form p+ emitter region 210, but thick enough to slow down the rate at which the atoms diffuse into the top layer 151 of SiGe epitaxial structure 150. As a result, the depth of p+ out-diffused emitter region 210 can be formed to be approximately the same as the depth of n+ out-diffused emitter region 158.

One of the drawbacks of SiGe heterojunction bipolar structure 200 is that SiGe heterojunction bipolar structure 200 has a significantly larger 1/f noise than SiGe heterojunction bipolar structure 100 due to the presence of oxide layer 212. In addition, next generation HBTs commonly use epitaxially-grown single-crystal silicon structures to form the emitters in lieu of polysilicon structures like polysilicon structure 180. However, an oxide layer like oxide layer 212 cannot be used with epitaxially-grown single-crystal silicon emitters to reduce the depth of the p+ out-diffused emitter region because single-crystal silicon cannot be epitaxially grown on oxide. Thus, there is a need for a SiGe HBT with a shallow p+ out-diffused emitter region which is approximately equal to the depth of the n+ out-diffused emitter region.

DETAILED DESCRIPTION OF THE INVENTION

Figure 3:
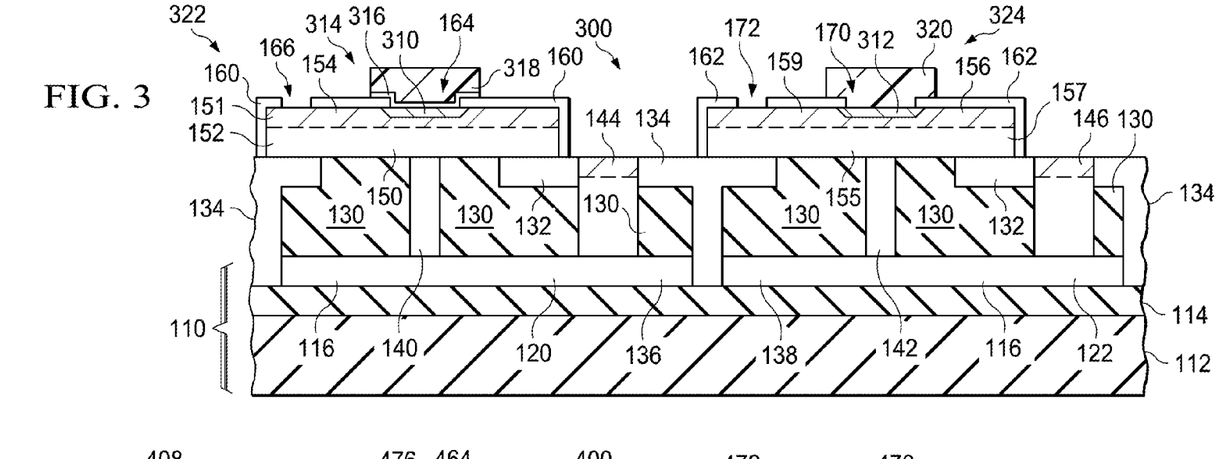
FIG. 3 is a cross-sectional view illustrating an example of a SiGe heterojunction bipolar structure 300 in accordance with the present invention.

FIG. 3 shows a cross-sectional view that illustrates an example of a SiGe heterojunction bipolar structure 300 in accordance with the present invention. SiGe heterojunction bipolar structure 300 is similar to SiGe heterojunction bipolar structure 100 and, as a result, utilizes the same reference numerals to designate the elements that are common to both structures.

As shown in FIG. 3, SiGe heterojunction bipolar structure 300 differs from SiGe heterojunction bipolar structure 100 in that SiGe heterojunction bipolar structure 300 utilizes a p+ out-diffused emitter region 310 in lieu of p+ out-diffused emitter region 153. P+ out-diffused emitter region 310 is similar to p+ out-diffused emitter region 153, except that p+ out-diffused emitter region 310 is smaller and shallower than p+ out-diffused emitter region 153. Thus, outer region 154 touches and horizontally surrounds a smaller p+ out-diffused emitter region 310.

SiGe heterojunction bipolar structure 300 also differs from SiGe heterojunction bipolar structure 100 in that SiGe heterojunction bipolar structure 300 utilizes an n+ out-diffused emitter region 312 in lieu of n+ out-diffused emitter region 158. N+ out-diffused emitter region 312 is similar to n+ out-diffused emitter region 158. Thus, outer region 159 touches and horizontally surrounds n+ out-diffused emitter region 312. P+ out-diffused emitter region 310 has a depth that is approximately the same as the depth of n+ out-diffused emitter region 312.

In addition, SiGe heterojunction bipolar structure 300 differs from SiGe heterojunction bipolar structure 100 in that SiGe heterojunction bipolar structure 300 replaces p+ polysilicon structure 180 with a p+ epitaxial structure 314. P+ epitaxial structure 314, in turn, has a number of layers including a bottom layer 316 and an upper layer 318 that touches and lies above bottom layer 316.

Bottom layer 316, which lies over isolation structure 160, includes a single-crystal region that touches the single-crystal p+ out-diffused emitter region 310. In addition, bottom layer 316 includes a single-crystal germanium region and a polycrystalline germanium region. Bottom layer 316 also has a heavy dopant concentration and a p conductivity type (p+). Thus, the single-crystal germanium region has a p+ dopant concentration.

Upper layer 318, in turn, includes a single-crystal silicon region that touches and lies over the single-crystal germanium region of bottom layer 316, and a polycrystalline silicon region that touches and lies over the polycrystalline germanium region of bottom layer 316. Further, upper layer 318 has a heavy dopant concentration and a p conductivity type (p+). Thus, the single-crystal silicon region has a p+ dopant concentration.

SiGe heterojunction bipolar structure 300 also differs from SiGe heterojunction bipolar structure 100 in that SiGe heterojunction bipolar structure 300 replaces n+ polysilicon structure 182 with an n+ epitaxial structure 320. N+ epitaxial structure 320, in turn, includes a single-crystal silicon region and a polycrystalline silicon region. The single-crystal silicon region of n+ epitaxial structure 320 touches the single-crystal n+ out-diffused emitter region 312 of SiGe epitaxial structure 155.

Thus, p+ epitaxial structure 314 and p+ out-diffused emitter region 310 form the emitter, the remaining portion of SiGe epitaxial structure 150 forms the n-type base, and the combination of p+ buried region 120, p− region 140, and p-type sinker region 144 form the collector of a pnp SiGe heterojunction bipolar transistor (HBT) 322.

Further, n+ epitaxial structure 320 and n+ out-diffused emitter region 312 form the emitter, the remaining p-type portion of SiGe epitaxial structure 155 forms the p-type base, and the combination of n+ buried region 122, n− region 142, and n-type sinker region 146 form the collector of a npn SiGe heterojunction bipolar transistor (HBT) 324.

In operation, during the anneal that causes the p-type atoms to out diffuse, the germanium in bottom layer 316 is thin enough to allow p-type atoms to diffuse from upper layer 318 into the top layer 151 of SiGe epitaxial structure 150 to form p+ out-diffused emitter region 310, but thick enough to slow down the rate at which the atoms diffuse into the top layer 151 of SiGe epitaxial structure 150. As a result, the depth of p+ out-diffused emitter region 310 can be formed to be approximately the same as the depth of n+ out-diffused emitter region 312.

Figure 4A:
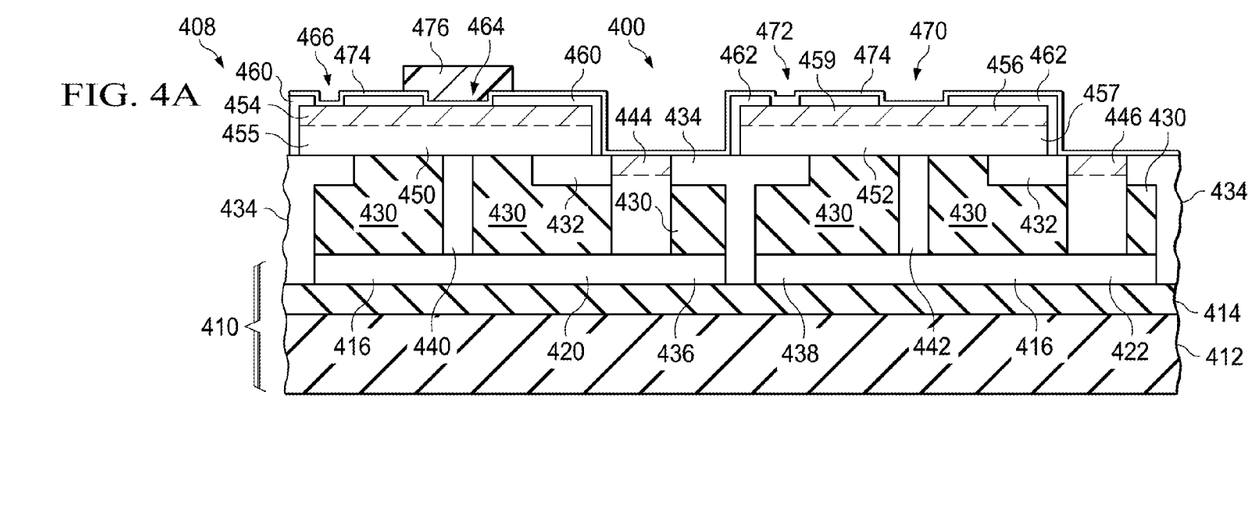
FIGS. 4A-4G are cross-sectional views illustrating a method 400 of forming a SiGe heterojunction bipolar structure in accordance with the present invention.

FIGS. 4A-4G show cross-sectional views that illustrate a method 400 of forming a SiGe heterojunction bipolar structure in accordance with the present invention. As shown in FIG. 4A, the method utilizes a conventionally-formed intermediate structure 408 that includes a silicon-on-oxide (SOI) wafer 410, which has a silicon handle wafer 412, a buried insulation layer 414 that touches silicon handle wafer 412, and a single-crystal silicon substrate 416 that touches buried insulation layer 414. Silicon substrate 416, in turn, has a p+ buried region 420 and an n+ buried region 422.

In addition, base structure 408 includes a single-crystal silicon epitaxial structure 430 that touches the top surface of silicon substrate 416. In the present example, epitaxial structure 430 has a very low dopant concentration and an n conductivity type (n−), except for regions of out diffusion. For example, a number of p-type atoms out diffuse from p+ buried layer 420 into epitaxial structure 430, and a number of n-type atoms out diffuse from n+ buried layer 422 into epitaxial structure 430. As a result, substantially all of epitaxial structure 430 has a very low dopant concentration.

Intermediate structure 408 also includes a number of shallow trench isolation structures 432 that touch epitaxial structure 430, and a deep trench isolation structure 434 that touches and extends through epitaxial structure 430 as well as silicon substrate 416 to touch buried insulation layer 414. Deep trench isolation structure 434 forms an electrically-isolated, single-crystal silicon region 436, and a laterally-adjacent, electrically-isolated, single-crystal silicon region 438.

In addition, intermediate structure 408 includes a lightly-doped, p conductivity type (p−) region 440 that extends from the top surface of silicon epitaxial structure 430 down through epitaxial structure 430 to touch p+ buried region 420, and a lightly-doped, n conductivity type (n−) region 442 that extends from the top surface of silicon epitaxial structure 430 down through epitaxial structure 430 to touch n+ buried region 422.

Intermediate structure 408 also includes a p conductivity type sinker region 444 that extends from the top surface of silicon epitaxial structure 430 down through epitaxial structure 430 to p+ buried region 420, and an n conductivity type sinker region 446 that extends from the top surface of silicon epitaxial structure 430 down through epitaxial structure 430 to n+ buried region 422.

Sinker region 444 includes a heavily-doped, p conductivity type (p+) surface region and a moderately-doped, p conductivity type (p) lower region, while sinker region 446 includes a heavily-doped, n conductivity type (n+) surface region and a moderately-doped, n conductivity type (n) lower region.

Further, intermediate structure 408 includes a SiGe epitaxial structure 450 that touches and lies over silicon epitaxial structure 430, a shallow trench isolation structure 432, and p− region 440. Intermediate structure 408 also includes a SiGe epitaxial structure 452 that touches and lies over silicon epitaxial structure 430, a shallow trench isolation structure 432, and n− region 442.

SiGe epitaxial structure 450 has a number of layers including a top layer 454 and a lower layer 455 that touches and lies below top layer 454. Top layer 454 includes a single-crystal silicon region and a polycrystalline silicon region. In addition, top layer 454 has a very low dopant concentration and, in the present example, an n conductivity type (n−).

Lower layer 455, in turn, includes a single-crystal germanium region that touches the single-crystal silicon region of top layer 454, and a polycrystalline germanium region that touches the polycrystalline silicon region of top layer 454. Lower layer 455 also has a heavy dopant concentration and an n conductivity type (n+).

Similarly, SiGe epitaxial structure 452 has a number of layers including a top layer 456 and a lower layer 457 that touches and lies below top layer 456. Top layer 456 includes a single-crystal silicon region and a polycrystalline silicon region. In addition, top layer 456 has a very low dopant concentration and, in the present example, an n conductivity type (n−).

Lower layer 457, in turn, includes a single-crystal germanium region that touches the single-crystal silicon region of top layer 456, and a polycrystalline germanium region that touches the polycrystalline silicon region of top layer 456. Lower layer 457 also has a heavy dopant concentration and a p conductivity type (p+).

Intermediate structure 408 additionally includes an isolation structure 460 that touches SiGe epitaxial structure 450, and an isolation structure 462 that touches SiGe epitaxial structure 452. The isolation structures 460 and 462 are electrically non-conductive. Isolation structure 460 has an emitter opening 464 that exposes the single-crystal silicon region of top layer 454 of SiGe epitaxial structure 450, and a contact opening 466 that exposes the polycrystalline silicon region of top layer 454 of SiGe epitaxial structure 450. Similarly, isolation structure 462 has an emitter opening 470 that exposes the single-crystal silicon region of top layer 456 of SiGe epitaxial structure 452, and a contact opening 472 that exposes the polycrystalline silicon region of top layer 456 of SiGe epitaxial structure 452.

As further shown in FIG. 4A, method 400 begins by epitaxially growing a lower layer 474 in a conventional manner on the exposed single-crystal silicon regions and the polycrystalline silicon regions of the SiGe epitaxial structures 450 and 452. Lower layer 474 is also grown on p sinker region 444 and n sinker region 446. Lower layer 474 is further grown on the isolation structures 460 and 462 as well as on the shallow trench isolation structures 432 and deep trench isolation structure 434.

Lower layer 474 has a single-crystal region that touches and lies over the single-crystal silicon region of top layer 454 of SiGe epitaxial structure 450, and a single-crystal region that touches and lies over the single-crystal silicon region of top layer 456. Lower layer 474 also has a single-crystal region that touches and lies over single-crystal p sinker region 444, and a single-crystal region that touches and lies over the single-crystal n sinker region. Lower layer 474 has a polycrystalline region that touches and lies over the isolation structures 432, 434, 460 and 462.

In addition, lower layer 474 includes a single-crystal germanium region and a polycrystalline germanium region, and can optionally include single-crystal silicon and polycrystalline silicon that lie below and/or above the germanium. After lower layer 474 has been grown, a patterned photoresist layer 476 is formed on lower layer 474 in a conventional manner.

Figure 4B:
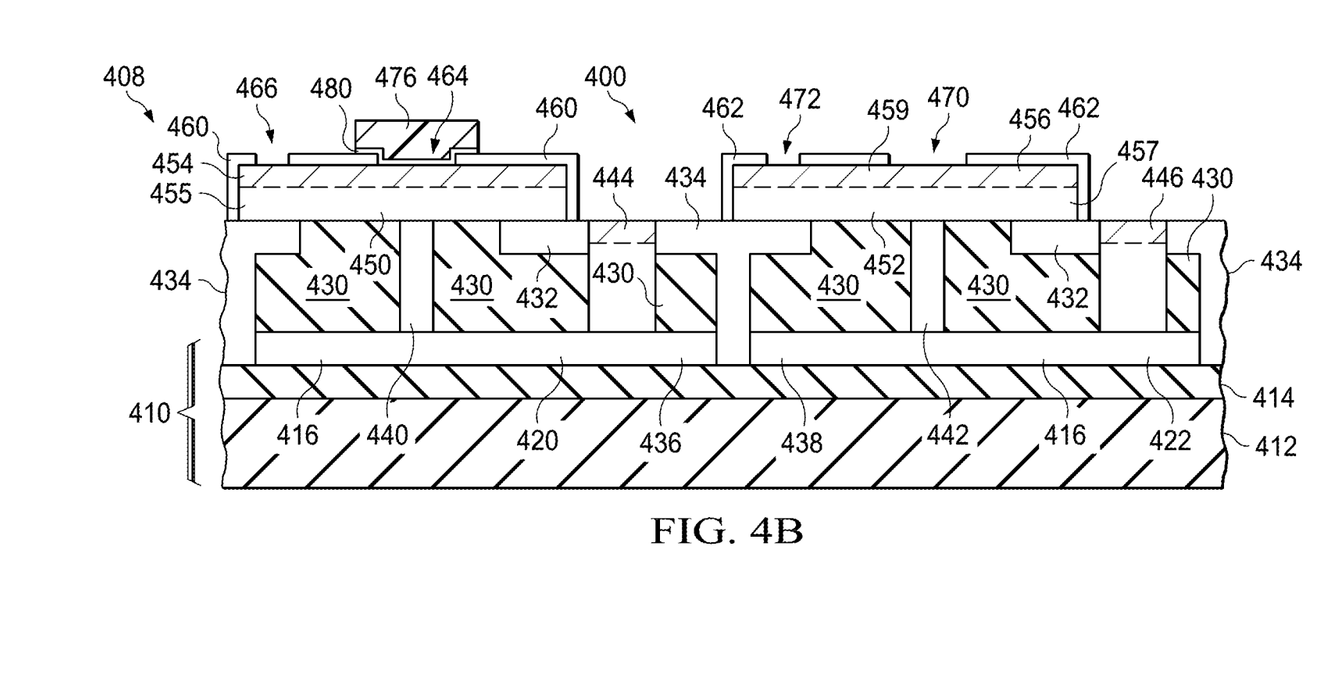

Following the formation of patterned photoresist layer 476, as shown in FIG. 4B, the exposed regions of lower layer 474 are etched to form a lower structure 480. Lower structure 480 touches the single-crystal silicon region of top layer 454 of SiGe epitaxial structure 450 which is exposed by emitter opening 470, and the top surface of isolation structure 460. As a result, lower structure 480 has a single-crystal region that touches and lies over top layer 454 of SiGe epitaxial structure 450, and a polycrystalline structure that touches and lies over isolation structure 460. After lower structure 480 has been formed, patterned photoresist layer 476 is removed in a conventional manner.

Figure 4C:
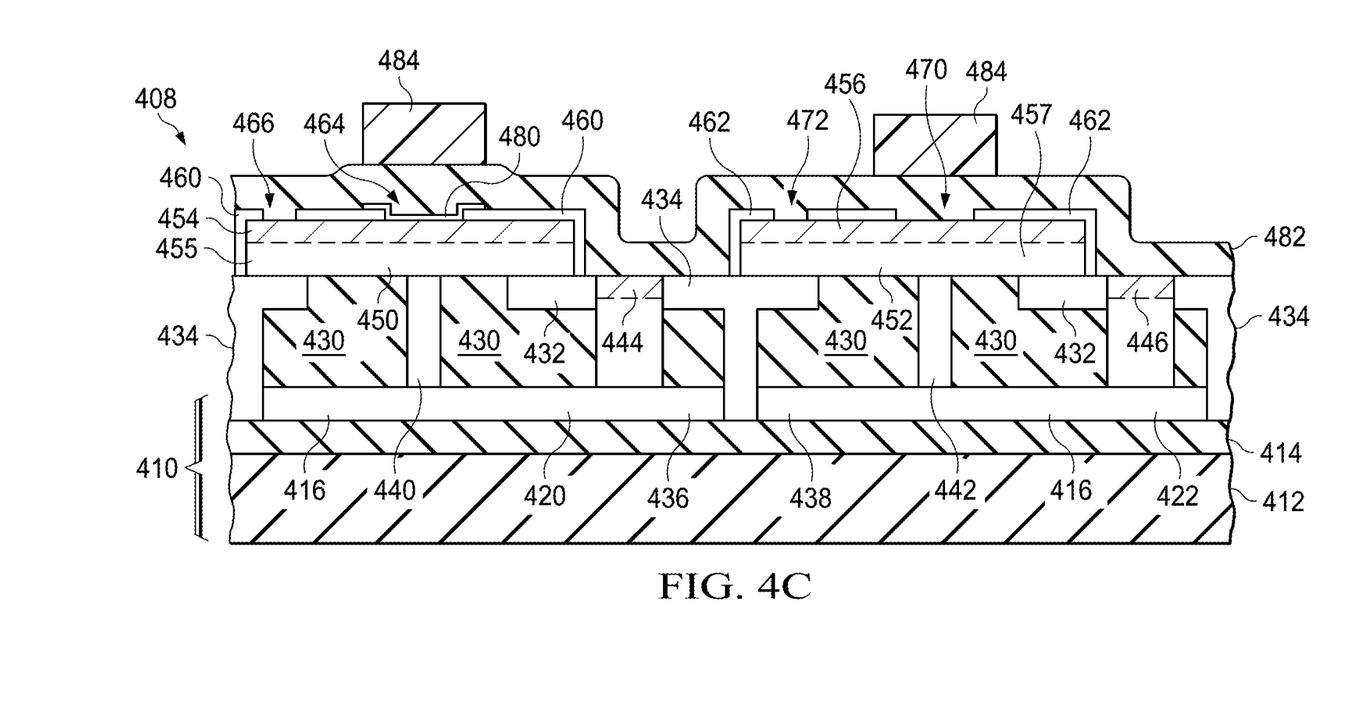

As shown in FIG. 4C, after patterned photoresist layer 476 has been removed, an upper layer 482 is epitaxially grown in a conventional manner on lower structure 480 and the single-crystal silicon region of top layer 456 of SiGe epitaxial structure 452. Upper layer 482 is also grown on the polycrystalline silicon regions of the SiGe epitaxial structures 450 and 452. In addition, upper layer 482 is grown on p sinker region 444 and n sinker region 446. Upper layer 482 is further grown on the isolation structures 460 and 462 as well as on the shallow trench isolation structures 432 and deep trench isolation structure 434.

Upper layer 482 has a single-crystal region that touches and lies over lower structure 480, and a single-crystal region that touches and lies over the single-crystal silicon region of top layer 456 of SiGe epitaxial structure 452 exposed by emitter opening 470.

Further, upper layer 482 has a single-crystal region that touches and lies over the single-crystal p sinker region 444, and a single-crystal region that touches and lies over the single-crystal n sinker region 446. Upper layer 482 has a polycrystalline region that touches and lies over the isolation structures 432, 434, 460 and 462. In addition, upper layer 482 includes silicon. After upper layer 482 has been grown, a patterned photoresist layer 484 is formed on upper layer 482 in a conventional manner.

Figure 4D:
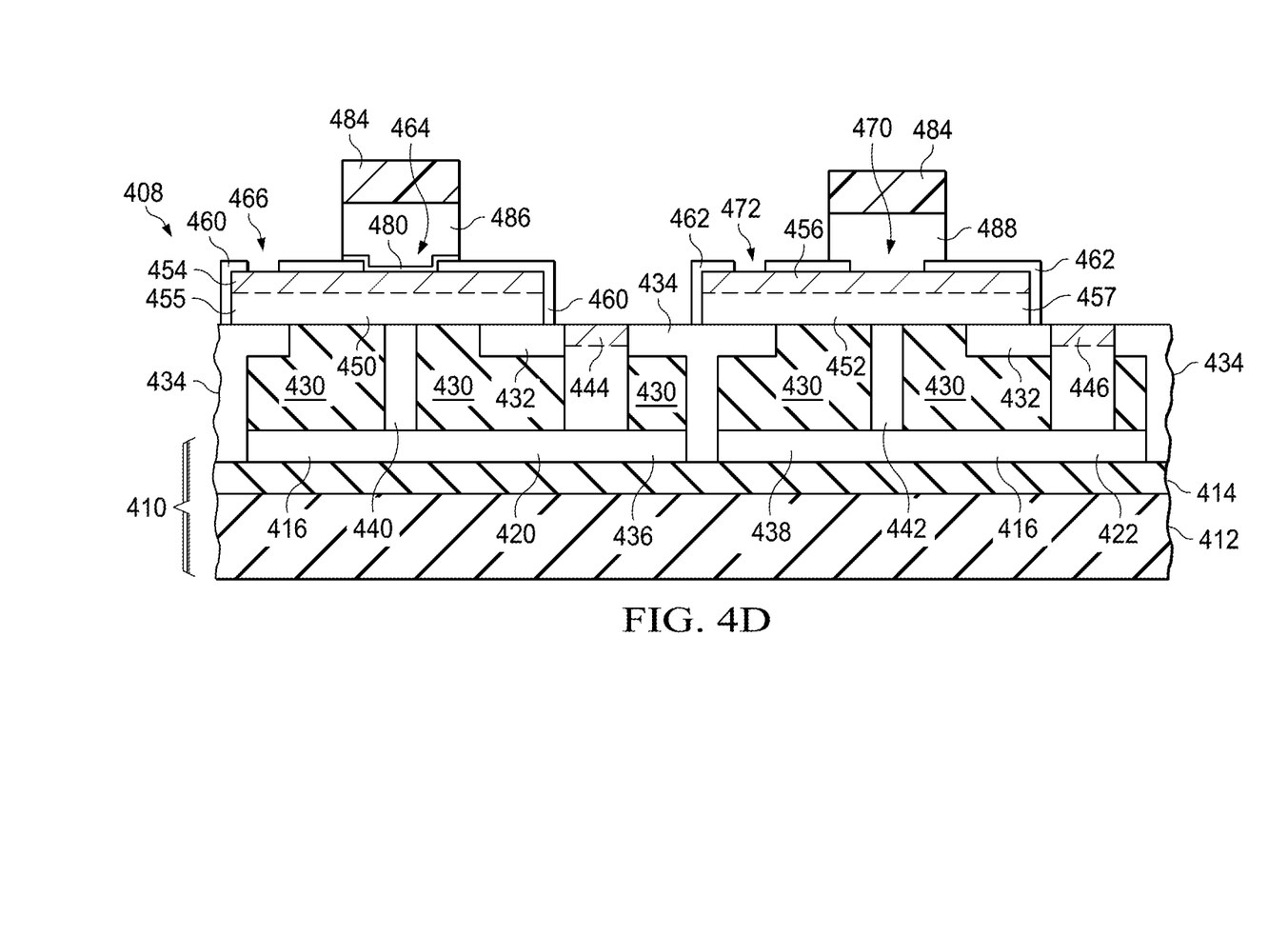

Following the formation of patterned photoresist layer 484, as shown in FIG. 4D, the exposed regions of upper layer 482 are etched to form a first upper structure 486 that touches lower structure 480, and a second upper structure 488 that touches the single-crystal silicon region of top layer 456 of SiGe epitaxial structures 452 which is exposed by emitter opening 470. After the upper structures 486 and 488 have been formed, patterned photoresist layer 484 is removed in a conventional manner.

Figure 4E:
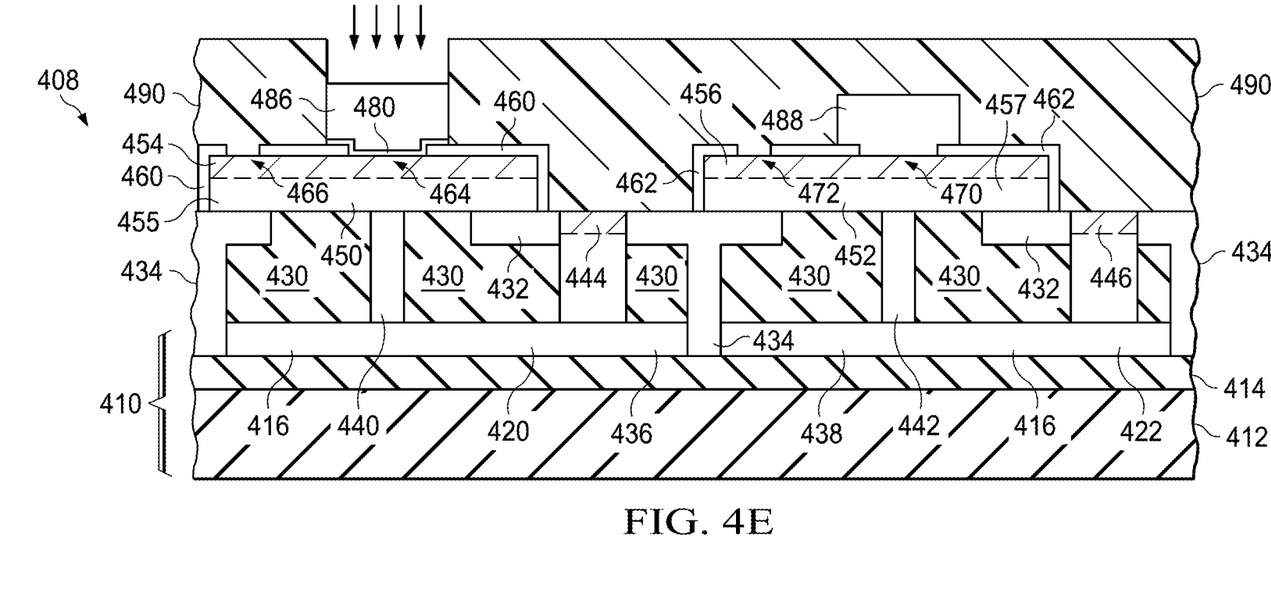

As shown in FIG. 4E, after patterned photoresist layer 484 has been removed, a patterned photoresist layer 490 is formed in a conventional manner. Following the formation of patterned photoresist layer 490, a p-type dopant, such as boron, is implanted through patterned photoresist layer 490 to heavily dope (p+) upper structure 486. After upper structure 486 has been doped, patterned photoresist layer 490 is removed in a conventional manner.

Figure 4F:
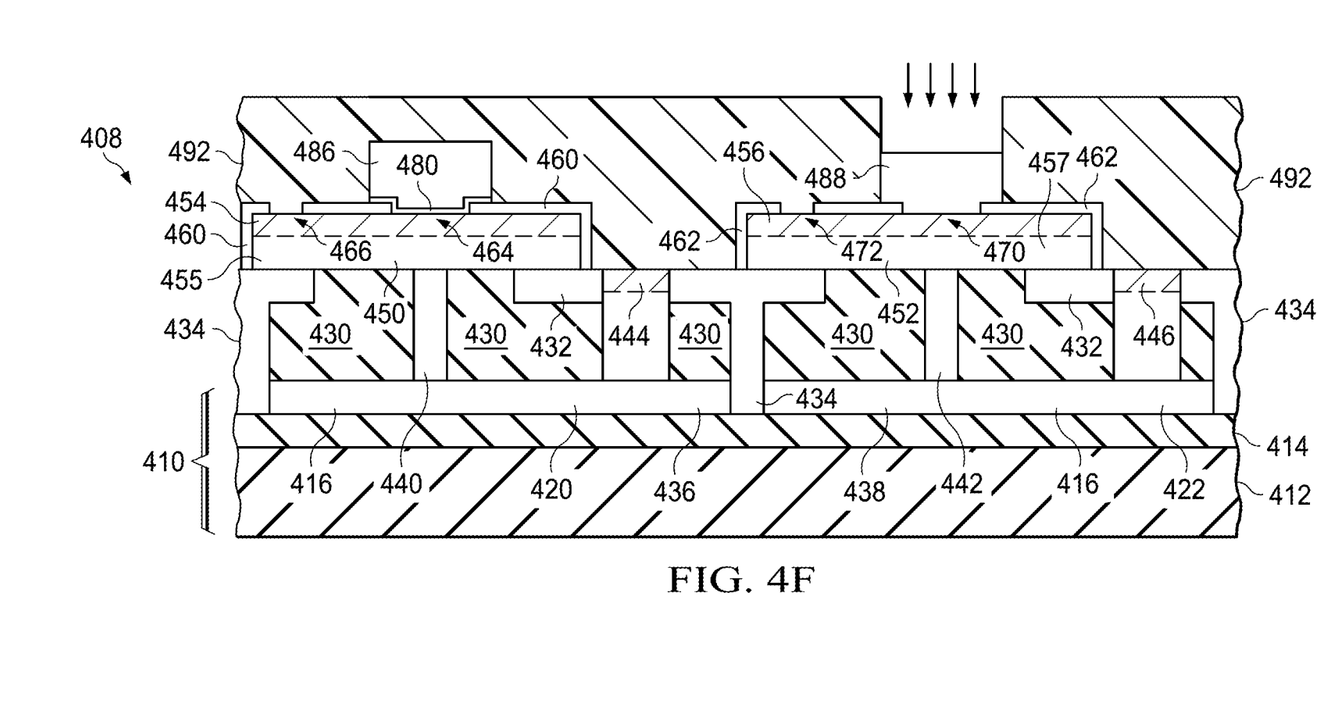

As shown in FIG. 4F, after patterned photoresist layer 490 has been removed, a patterned photoresist layer 492 is formed in a conventional manner. Following the formation of patterned photoresist layer 492, an n-type dopant, such as phosphorous, is implanted through patterned photoresist layer 492 to heavily dope (n+) upper structure 488. After upper structure 488 has been doped, patterned photoresist layer 492 is removed in a conventional manner.

Figure 4G:
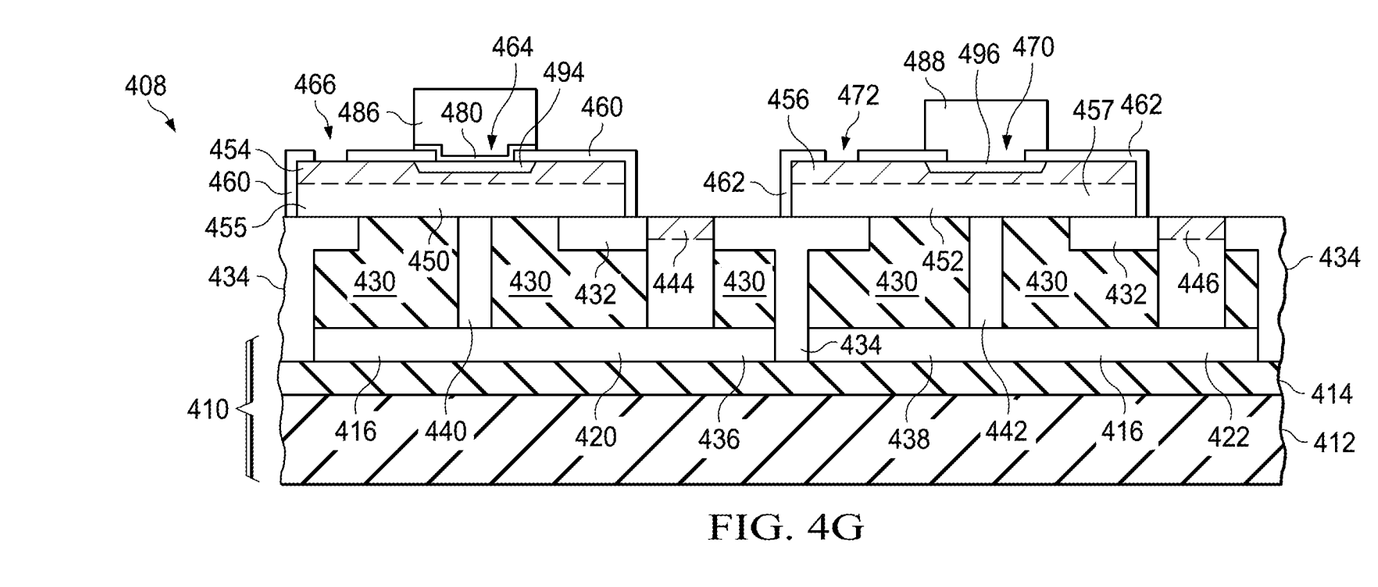

As shown in FIG. 4G, after patterned photoresist layer 492 has been removed, the doped structure is annealed in a conventional manner. During the anneal, the germanium in lower structure 480 is thin enough to allow p-type atoms to out diffuse from upper structure 486 into SiGe epitaxial structure 450 to form a p+ out-diffused emitter region 494, but thick enough to slow down the rate at which the atoms out diffuse into SiGe epitaxial structure 450.

At the same time, n-type atoms out diffuse from upper structure 488 into SiGe epitaxial structure 452 to form an n+ out-diffused emitter region 496. Thus, as a result of the slowing effect provided by the germanium, the depth of p+ out-diffused emitter region 494 can be formed to be approximately the same as the depth of n+ out-diffused emitter region 496. Method 400 then continues with conventional steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A bipolar structure comprising:
   a substrate structure having a first conductivity type;
   a first epitaxial structure that touches the substrate structure, the first epitaxial structure including single-crystal silicon;
   a second epitaxial structure that touches the first epitaxial structure, the second epitaxial structure including a first single-crystal germanium region, the first single-crystal germanium region having a second conductivity type;

a non-conductive structure that touches the second epitaxial structure, the non-conductive structure having an emitter opening that exposes the second epitaxial structure; and a third epitaxial structure that touches the non-conductive structure and extends through the emitter opening to touch the second epitaxial structure, the third epitaxial structure including a second single-crystal germanium region, the second single-crystal germanium region having the first conductivity type.

2. The bipolar structure of claim 1 wherein the third epitaxial structure further includes a first single-crystal silicon region that touches and lies above the second single-crystal germanium region.

3. The bipolar structure of claim 2 wherein the first single-crystal silicon region has the first conductivity type.

4. The bipolar structure of claim 3 wherein the second epitaxial structure further includes a second single-crystal silicon region that touches and lies above the first single-crystal germanium region.

5. The bipolar structure of claim 4 wherein the third epitaxial structure touches the second single-crystal silicon region.

6. The bipolar structure of claim 5 wherein the second single-crystal silicon region includes the first conductivity type.

7. The bipolar structure of claim 1 wherein said second single-crystal germanium region of the third epitaxial structure touches a single-crystal silica region of the second epitaxial structure.

8. The bipolar structure of claim 1 wherein the second epitaxial structure further includes a first single-crystal silicon region that touches and lies above the first single-crystal germanium region.

9. The bipolar structure of claim 8 wherein the first single-crystal silicon region includes the first conductivity type.

10. The bipolar structure of claim 9 wherein the third epitaxial structure touches the first single-crystal silicon region.

11. The bipolar structure of claim 10 wherein the third epitaxial structure further includes a second single-crystal silicon region that touches and lies above the second single-crystal germanium region.

12. The bipolar structure of claim 11 wherein the second single-crystal silicon region has the first conductivity type.

* * * * *